United States Patent
Han

(10) Patent No.: US 7,570,526 B2
(45) Date of Patent: Aug. 4, 2009

(54) MEMORY DEVICE AND METHOD OF REPAIRING THE SAME

(75) Inventor: Jung Chul Han, Daejeon (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/617,226

(22) Filed: Dec. 28, 2006

(65) Prior Publication Data

US 2008/0112240 A1   May 15, 2008

(30) Foreign Application Priority Data

Oct. 31, 2006   (KR) .............................. 2006-106494

(51) Int. Cl.
*G11C 29/00* (2006.01)
(52) U.S. Cl. .................. 365/200; 365/185.09; 365/201
(58) Field of Classification Search ............. 365/185.02
See application file for complete search history.

(56) References Cited

U.S. PATENT DOCUMENTS

| | | | | |
|---|---|---|---|---|
| 4,701,887 A | * | 10/1987 | Ogawa | .................. 365/200 |
| 5,113,371 A | * | 5/1992 | Hamada | ..................... 365/200 |
| 6,141,267 A | * | 10/2000 | Kirihata et al. | ............. 365/200 |
| 6,349,061 B1 | * | 2/2002 | Yoneyama et al. | ...... 365/185.09 |
| 6,404,683 B1 | * | 6/2002 | Yumoto | ..................... 365/200 |
| 6,462,985 B2 | * | 10/2002 | Hosono et al. | ......... 365/185.09 |
| 7,224,605 B1 | * | 5/2007 | Moogat et al. | ......... 365/185.09 |
| 7,313,022 B2 | * | 12/2007 | Takeuchi et al. | ....... 365/185.09 |

FOREIGN PATENT DOCUMENTS

| | | |
|---|---|---|
| KR | 10-2001-0070382 A | 7/2001 |
| KR | 1020040008717 A | 1/2004 |
| KR | 10-2005-0058224 A | 6/2005 |

\* cited by examiner

*Primary Examiner*—Tan T. Nguyen
(74) *Attorney, Agent, or Firm*—Townsend and Townsend and Crew LLP

(57) ABSTRACT

A memory device includes a main memory cell having a plurality of first memory cells for storing data, wherein a special block for storing a column address corresponding to a first memory cell having at least one failure is disposed in a part of area of the main memory cell; a start address block configured to store address information initiated by the special block of the main memory cell; and a repair information block configured to provisionally store the column address stored in the special block, and to output a repair controlling signal when operating the memory device.

17 Claims, 6 Drawing Sheets

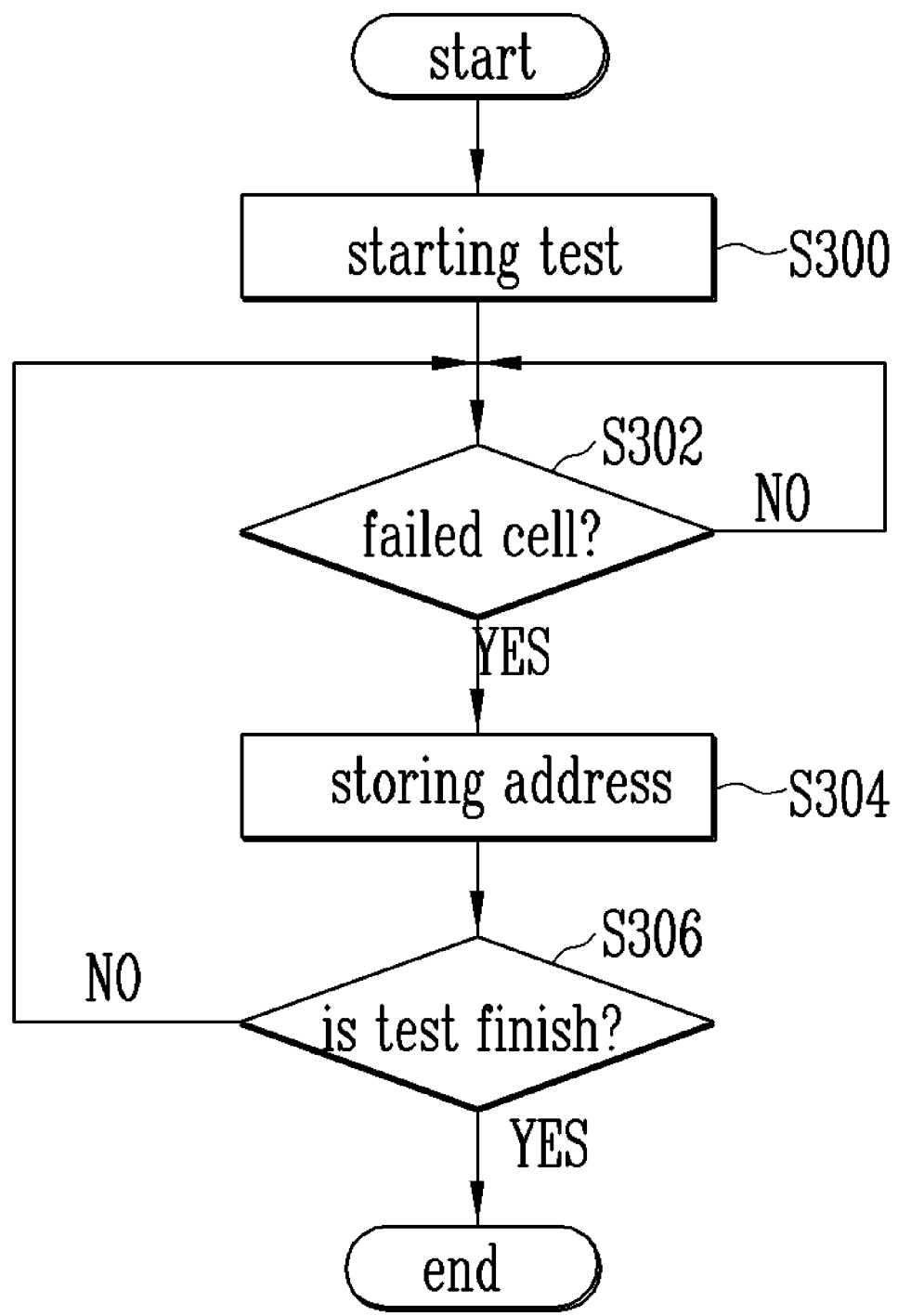

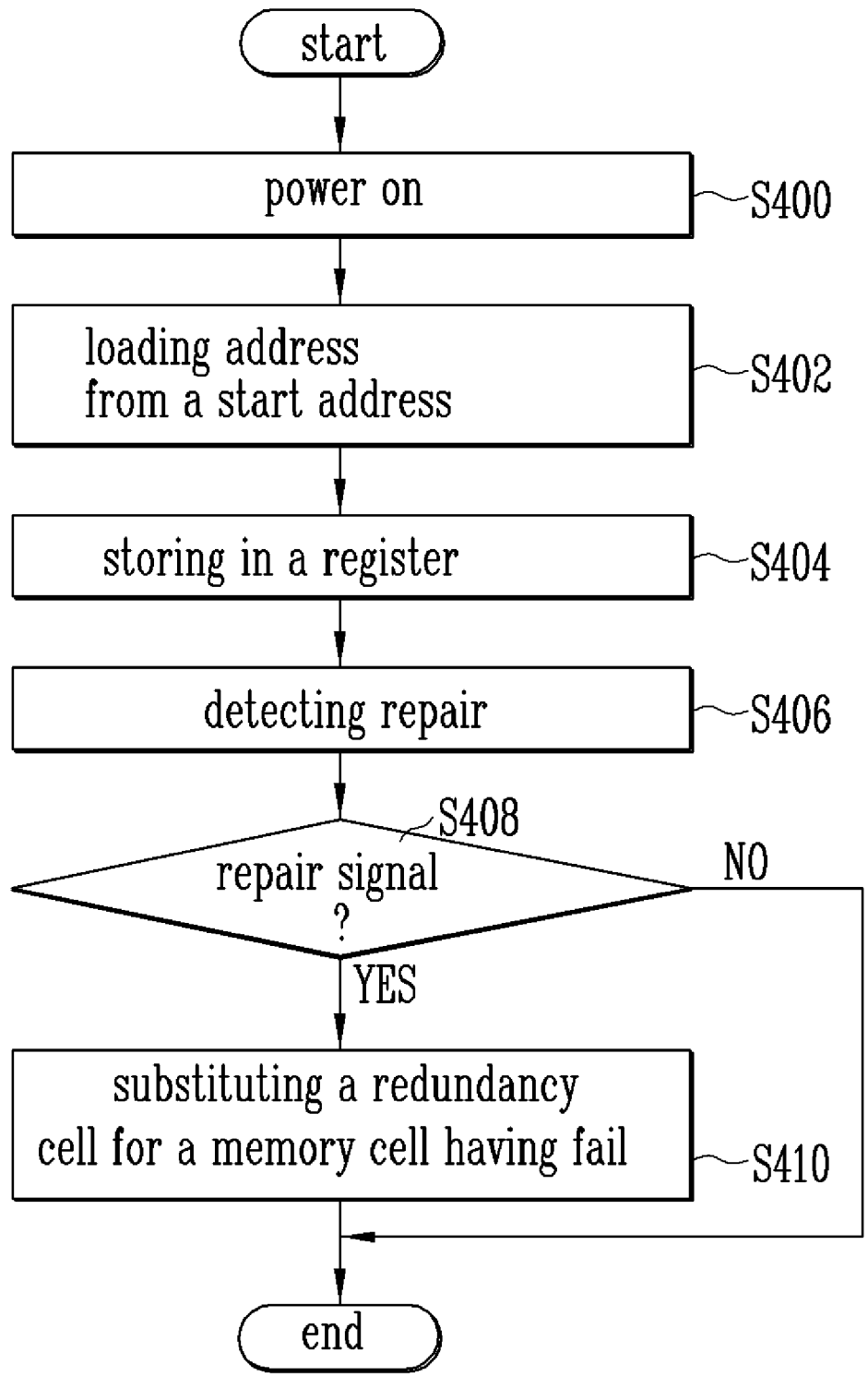

MEMORY DEVICE AND METHOD OF REPAIRING THE SAME

CROSS-REFERENCE TO RELATED APPLICATIONS

This application claims priority from Korean Patent Application No. 2006-106494, filed on Oct. 31, 2006, the contents of which are incorporated herein by reference in its entirety.

BACKGROUND OF THE INVENTION

The present invention relates to a memory device and a method of repairing the same. More particularly, the present invention relates to a memory device and a method of repairing the same which performs repair of at least one memory cell using a latch circuit and a register.

Generally, a NAND flash memory device adds a redundancy cell to a main memory cell to enhance the yield thereof. Accordingly, when at least one failure occurs to a certain memory cell, the NAND flash memory device employs a repairing method of substituting the redundancy cell for the failed memory cell.

When an address signal is inputted to the redundancy cell in the memory device, a redundancy detecting circuit detects the address signal and outputs a repair controlling signal including repair information. In addition, the redundancy detecting circuit stores repair address information programmed by a fuse device.

The failed memory cell is substituted with a redundancy memory cell, i.e. is repaired in accordance with the repair controlling signal.

FIG. 1 is a view illustrating a redundancy circuit for repairing a common memory device in accordance with conventional methods.

Referring to FIG. 1, the redundancy circuit includes a guard fuse block 110 and an address fuse block 120.

The guard fuse block 110 includes a guard fuse (hereinafter, referred to as "GF"), a first to third invertors IN1 to IN3, and a first and second N-MOS transistors N1 and N2.

The address fuse block 120 has a first P-MOS transistor PI, a third to eleventh N-MOS transistors N3 to N11, a fourth and fifth inverters IN4 and IN5, and a first to eighth address fuses (hereinafter, referred to as "AF") AF1 to AF8.

Address signals RLA<0:3> and RLAb<0:3> are inputted to the third to tenth N-MOS transistors included in the address fuse block 120. The third to tenth N-MOS transistors store a repair address signal according as the guard fuse GF depending on a repair address and a first, fourth, fifth and eighth address fuses AF1, AF4, AF5 and AF8 are cut.

When a power source is inputted to the redundancy circuit, current flows from a node C in the direction of an arrow P. A repair signal REPb having low logic (e.g., 0 V) is outputted by the current flowing from the node C, and a repair address signal is outputted in accordance with an inputted address.

When employing the redundancy circuit for column repair of the memory device, many fuse devices are required.

That is, the smaller the memory device is, the more repair fuses are required. In addition, since the fuse circuit for repairing detects the comparison of a column address through current sensing, the consumption of current in the memory device can become undesirably high. Furthermore, when a fuse is cut it is difficult to reuse the fuse.

SUMMARY OF THE INVENTION

The present invention provides a memory device for employing latches related to the number of column addresses and a method of repairing the same.

A memory device according to one embodiment of the present invention includes: a main memory cell including a plurality of first memory cells configured to store data, wherein a special block for storing a column address corresponding to a first memory cell having at least one failure is disposed in a part of area of the main memory cell; a start address block configured to store address information initiated by the special block of the main memory cell; and a repair information block configured to provisionally store the column address stored in the special block, and to output a repair controlling signal when the memory device is in operation.

The special block may include cascading columns made up of cells.

The start address block may include a plurality of fuses for storing a start address of the special block.

The repair information block includes a plurality of registers configured to store the column address stored in the special block, respectively; and a plurality of repair circuits coupled respectively to the registers, and configured to output the repair controlling signal.

Each of the registers includes a column address; a data input/output bus information assigned to the column address; and a flag information configured to indicate storage of the column address information.

Each of the repair circuits includes a first buffer configured to output the column address by the flag information of corresponding register; a plurality of XOR gates, wherein the column address outputted through the first buffer is inputted to one of input terminals of each of the XOR gates, and an address inputted for operating the memory device is inputted to the other terminal of each of the XOR gates; a NOR gate configured to receive the outputs of the XOR gates; and a second buffer configured to output the data input/output bus information of the corresponding register in accordance with an output of the NOR gate, wherein the output of the NOR gate is generated by using the outputs of the XOR gates as input of the NOR gate.

The memory device further includes a redundancy cell array including a plurality of second memory cells configured to substitute a first memory cell having a memory cell with at least one failure and to store data; and a data input/output controlling block configured to substitute the failed memory cell with a redundancy cell in accordance with an output of the repair information block.

The data input/output controlling block receives the repair controlling signal and the data input/output bus information from the repair information block.

A method of repairing a memory device according to one embodiment of the present invention includes: testing memory cells included in a main cell array of the memory device, thereby detecting whether or not the memory cells have at least one failure; and storing in sequence address information of a failed cell in a predetermined special block included in the main cell array in accordance with the detection result.

The method may further include storing a start address of the special block through fuse cutting.

The address information stored in the special block includes a column address corresponding to the cell having at least one failure and a data input/output bus information assigned for data input/output of corresponding column.

The method may further include storing the address stored in the special block in each of registers by loading in sequence the address; and comparing an inputted address with the address stored in the register, and outputting a repair controlling signal in accordance with the comparison result.

As described above, a memory device and a method of repairing the same in accordance with embodiments of the present invention stores column address information corresponding to memory cell to be repaired in a main cell, and repairs using extra repair register and circuit so that a repair circuit including a fuse is reduced. As a result, area that the repair circuit occupies in the memory device may be decreased.

BRIEF DESCRIPTION OF THE DRAWINGS

The above and other features and advantages of the present invention will become readily apparent by reference to the following detailed description when considered in conjunction with the accompanying drawings wherein:

FIG. 3 is a flow chart illustrating a method of repairing the memory device according to one embodiment of the present invention; and FIG. 4 is a flow chart illustrating an operating process after the process of repairing the memory device according to one embodiment of the present invention.

DESCRIPTION OF SPECIFIC EMBODIMENTS

Hereinafter, embodiments of the present invention will be explained in more detail with reference to the accompanying drawings.

Figure 1:
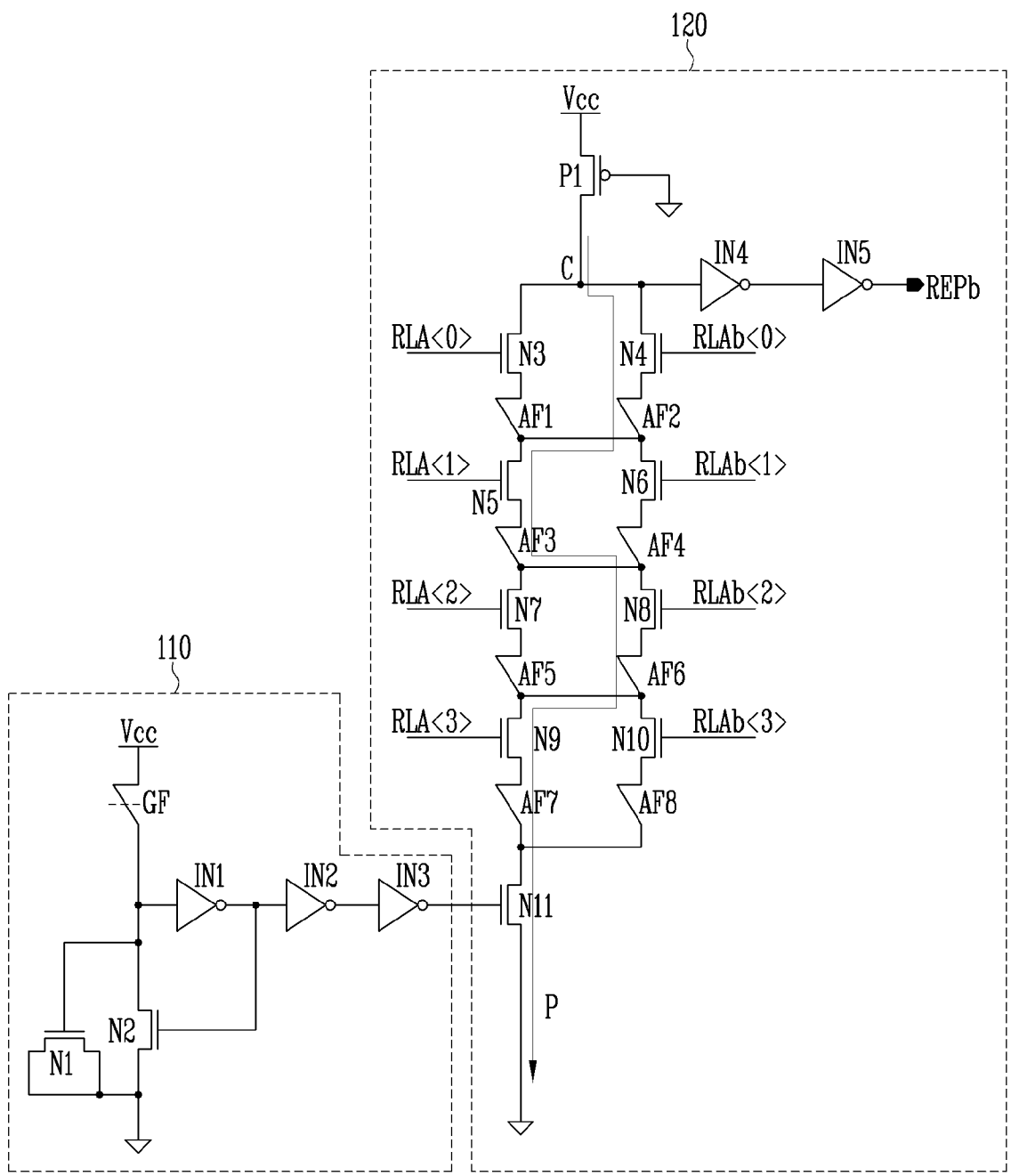
FIG. 1 is a view illustrating a conventional redundancy circuit for repairing a common memory device.
Figure 2A:
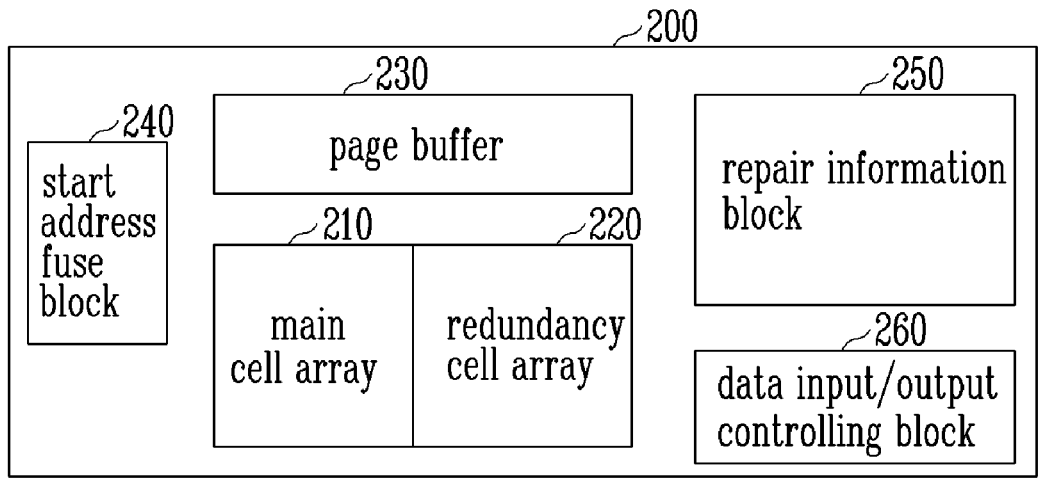
FIG. 2A is a block diagram illustrating a memory device according to one embodiment of the present invention.

FIG. 2A is a block diagram illustrating a memory device according to one embodiment of the present invention.

Referring to FIG. 2A, the memory device 200 of the present invention includes a main cell array 210 having a plurality of memory cells for storing data, a redundancy cell array 220, a page buffer 230 for programming data in the main cell array 210 and the redundancy cell array 220 and reading data from the main cell array 210 and the redundancy cell array 220, a start address fuse block 240 for storing address information for starting a repair process, a repair information block 250 for storing provisionally repair address information when the memory device 200 operates and outputting a repair controlling signal, and a data input/output controlling block 260 for performing input/out control so that a redundancy cell is substituted for a main cell in accordance with the repair controlling signal outputted from the repair information block 250.

The main cell array 210 includes a plurality of memory cells, and is configured to store data. In addition, the main cell array 210 may have a special block (not shown) for storing repair address information in some thereof.

The redundancy cell array 220 includes a plurality of memory cells like the memory cell array 210, and substitutes memory cell having at least one failure in the main cell array 210.

The page buffer 230 performs input/output of data when programming data in the main cell array 210 or the redundancy cell array 220, or reading data from the main cell array 210 or the redundancy cell array 220.

The start address fuse block 240 stores start block address of the special block where repair address is stored by using the fuse cutting. In this case, the start address fuse block 240 may store address information using a fuse.

The repair information block 250 includes a circuit which receives the repair address information stored in the special block of the main cell array 210, provisionally (i.e., temporarily) stores the received repair address information, and outputs the repair controlling signal indicating whether or not an inputted column address is a repair address.

The data input/output controlling block 260 controls input/output of data so that a redundancy cell is substituted for a main cell having at least one failure in accordance with the repair controlling signal outputted from the repair information block 250.

Hereinafter, the memory device of the present invention will be described in detail.

Figure 2B:
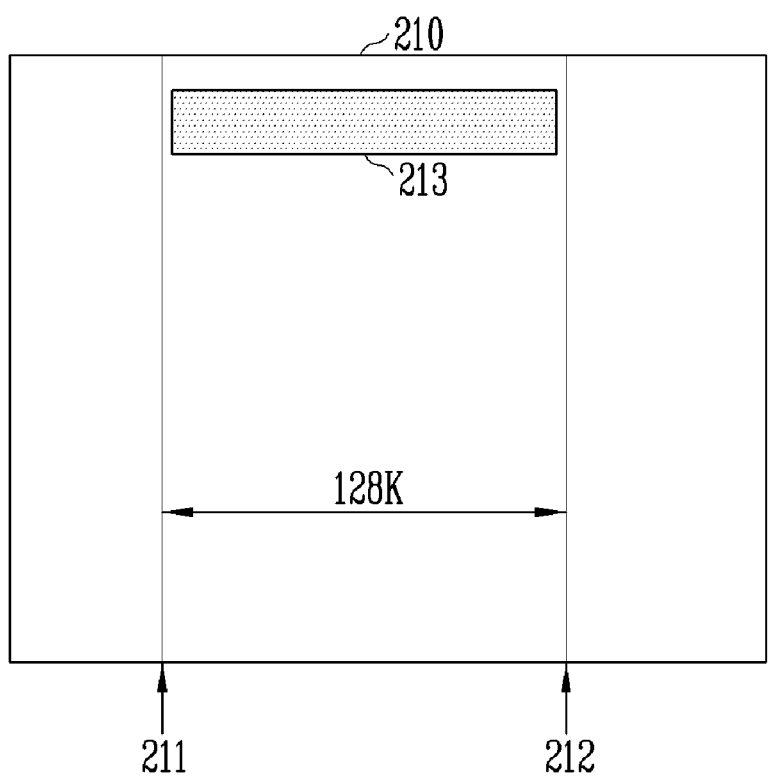
FIG. 2B is a block diagram illustrating the memory cell array in FIG. 2A according to one embodiment of the present invention.

FIG. 2B is a block diagram illustrating the memory cell array in FIG. 2A.

Referring to FIG. 2B, in the main cell array 210 of the memory device 200, the memory cells (not shown) are coupled in series between a bit line (not shown) and a cell source line (hereinafter, referred to as "CSL").

When a failure occurs to partial column line 211 or/and 212 in the main cell array 210, a column line in the redundancy cell array 220 is substituted for the partial column line 211 or/and 212 for repairing. The repair address information corresponding to the failed memory (e.g., a memory cell with at least one failure) is stored in the special block 213 preset in some of the main cell array 210. Here, the special block 213 where the repair address information is stored should be made up of normal columns, and programs to cascading columns.

For example, when one page of the main cell array 210 corresponds to 2 Kbytes and has sixteen IO (input/output), one IO may have a column of 1 Kbit. Here, in case of repairing maximum 256 columns, minimum number of cascading columns is 10 columns. Accordingly, one of the ten columns should be repaired.

Hereinafter, for example, a process of programming the column address information to column in units of 128 columns will be described. Here, since 128 bytes are programmed in one page, four pages are required for programming 256 columns of information.

Accordingly, the special block 213 in the main cell array 210 includes four pages having 128 Kbytes, respectively.

Address information of column corresponding to a failed cell is stored in sequence in the special block 213, wherein at least one failure of the failed cell is found in a process of testing the memory device 200.

After the repair of the memory cell 200 is finished, the repair address information stored in the special block 213 is loaded by the page buffer 230 for normal operation when initial driving of the memory device 200, and then is transmitted to the repair information block 250. In this case, start address information for indicating the start of the special block 213 is stored in the start address fuse block 240 by using a fuse cutting method. In other words, address information of a start address included in the start address information to a certain address in the special block 213 is the repair address information.

Hereinafter, the repair information block 250 for provisionally storing the repair address information stored in the special block 213 and outputting the repair controlling signal will be described in detail with reference to the accompanying drawings.

Figure 2C:
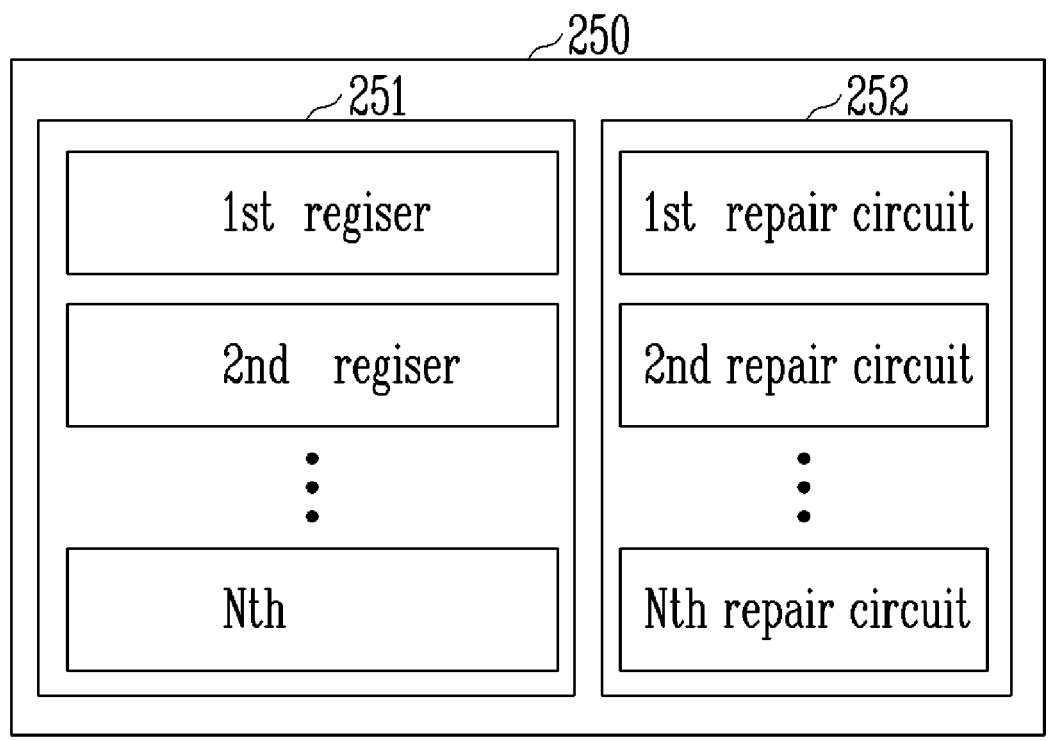
FIG. 2C is a block diagram illustrating the repair information block in FIG. 2A according to one embodiment of the present invention.

FIG. 2C is a block diagram illustrating the repair information block in FIG. 2A.

Referring to FIG. 2C, the repair information block 250 in the memory device 200 according to one embodiment of the present invention includes a register section 251 having a first to Nth registers and a repair section 252 having a first to Nth repair circuits.

In some embodiments, each of the first to Nth registers stores the repair address information stored in the special block 213 of the memory cell 210, and has 16 bits.

Figure 2D:
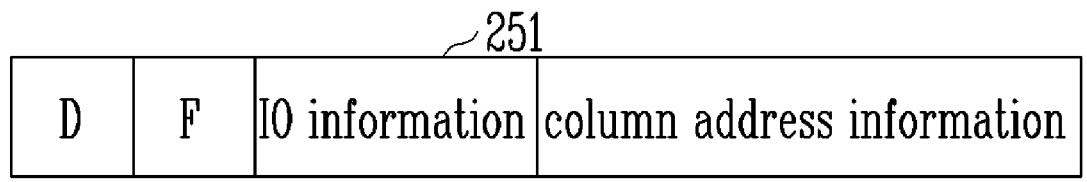
FIG. 2D is a block diagram illustrating the register in FIG. 2C according to one embodiment of the present invention.

FIG. 2D is a block diagram illustrating the first register in FIG. 2C.

Referring to FIG. 2D, the first register in the register section 251 includes a D field, a flag field F (i.e., REG0_FLAG) indicating whether or not the repair address information is stored, a data input/output bus information field IO information (i.e., REG0_IOBUS<3:0>) of 4 bits, and a repair column address information field (i.e., REG0_COL<9:0>) of 10 bits.

In some embodiments, the second to Nth registers have the same structure as the first register, i.e. REGN_FLAG, REGN_IOBUS<3:0> and REGN_COL<9:0>.

In some embodiments, the D field is a field not used as a redundant field capable of storing data.

In some embodiments, The repair controlling signal using an address information stored in the first register is outputted by the first repair circuit.

The first to Nth registers may be made up of a circuit such as a latch for provisionally storing data with a power source that is turned on.

Figure 2E:
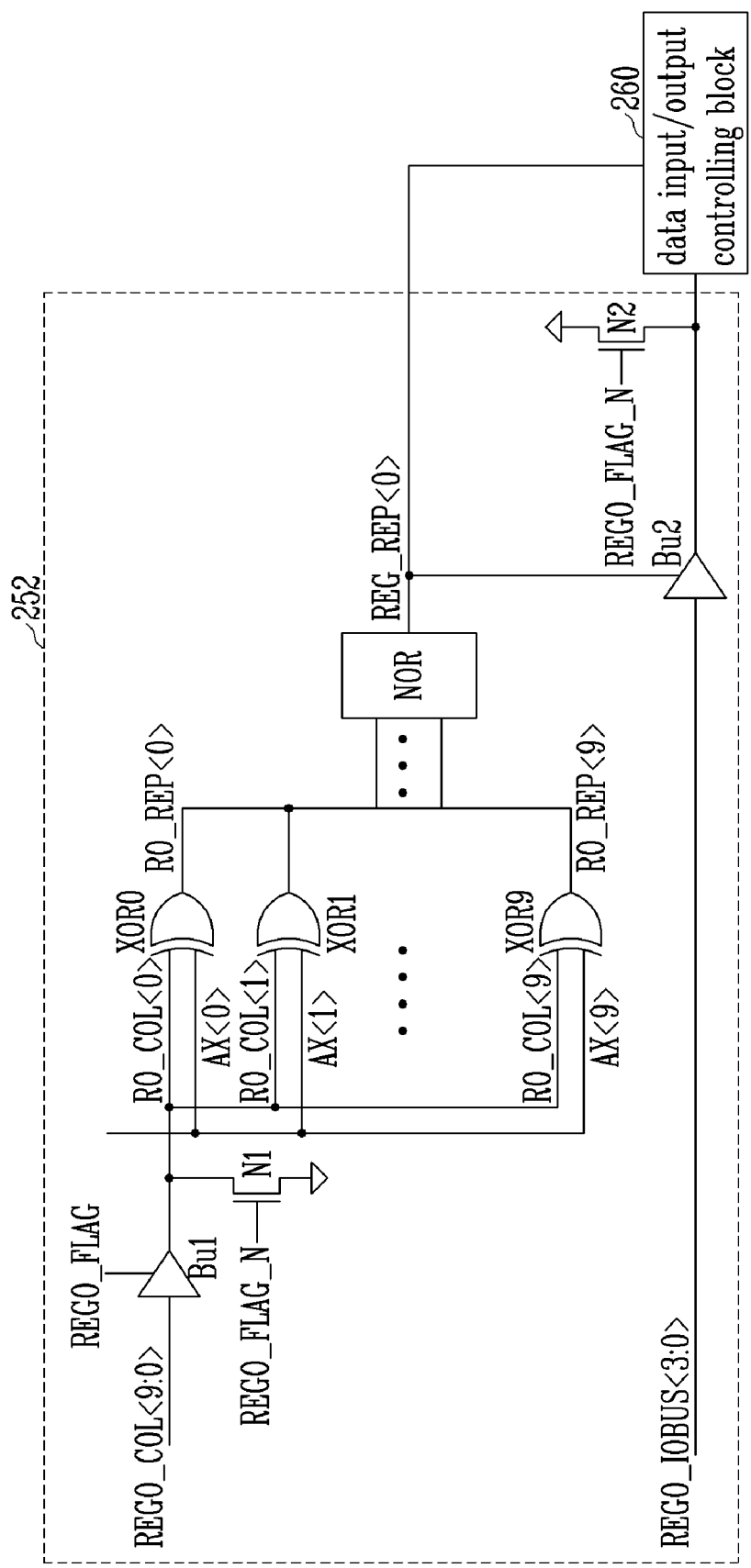
FIG. 2E is a block diagram illustrating the first repair circuit in FIG. 2C according to one embodiment of the present invention.

FIG. 2E is a block diagram illustrating the first repair circuit in FIG. 2C.

Referring to FIG. 2E, the first repair circuit includes a first buffer Bu1, a second buffer Bu2, a first to tenth XORs XOR0 to XOR9, a NOR gate, and a first and second N-MOS transistors N1 and N2.

In some embodiments, the second to Nth repair circuits have the same constitution as the first repair circuit.

The first buffer Bu1 receives the column address information REG0_COL<9:0> of the first register, and then outputs the received column address information REG0_COL<9:0>, respectively. In this case, the first buffer Bu1 is controlled in accordance with the flag field REG0_FLAG That is, when the value of the flag field REG0_FLAG is '0', the column address value is not outputted. However, when the value of the flag field REG0_FLAG is '1', the column address value is outputted.

Each of the column address values REG0_COL<9:0> outputted from the first buffer Bu1 is inputted to one of input terminals of each of the first to tenth XORs XOR0 to XOR9.

The first N-MOS transistor N1 drives by an inverse value of the flag field REG0_FLG, and connects an output of the first buffer Bu1 to a ground voltage in case that value of the flag field REG0_FLG is '0' so that low values are inputted to the first to tenth XORs XOR0 to XOR9.

Each of column address information AX<9:0> is inputted to the other input terminal of each of the first to tenth XORs XOR0 to XOR9. Here, the column address is inputted when a main cell is selected for operation.

Each of the first to tenth XORs XOR0 to XOR9 outputs '0' logic condition when the same values are inputted to the input terminals of each of the first to tenth XORs XOR0 to XOR9. Accordingly, outputs of every XORs XOR0 to XOR9 are '0' only when the inputted column address information AX<9:0> and column address field R0_COL<9:0> of the first register have the same values.

In case that the every outputs of the XORs XOR0 to XOR9 are '0', the repair controlling signal REG0_REP outputted through the NOR gate has '1'.

The repair controlling signal REG0_REP is inputted to the data input/output controlling block 260, and also is inputted to the second buffer Bu2.

The second buffer Bu2 outputs data input/output bus information REG0_IOBUS<3:0> in accordance with the repair controlling signal REG0_REP.

In case that the repair controlling signal REG0_REP has '1', the data input/output bus information REG0_IOBUS<3:0> stored in the first register is transmitted to the data input/output controlling block 260.

The data input/output controlling block 260 discriminates that corresponding column address is repaired only when the data input/output controlling block 260 receives the repair controlling signal REG0_REP and the data input/output bus information REG0_IOBUS<3:0> together, and performs input/output control so that a redundancy cell is substituted for a main cell having at least one failure in accordance with the discrimination result.

As described above, the first repair circuit in accordance with an embodiment of the present invention has the same structure over each of the registers, and inputs the repair controlling signal REGN_REP and the data input/output bus information REGN_IOBUS<3:0> into the data input/output controlling block 260.

Hereinafter, a method of repairing the memory device by using the repair information block 250 will be described in detail.

FIG. 3 is a flow chart illustrating a method of repairing the memory device according to one embodiment of the present invention.

Referring to FIG. 3, in step of S302, the memory device according to one embodiment of the present invention detects cell having at least one failure in the main cell array 210 in a process of testing the memory device, i.e. step of S300.

In step of S304, a column address corresponding to the failed cell (e.g., a memory cell having at least one failure) is stored in the special block 213 of the main cell array 210. Information stored in the special block 213 includes the column address and data input/output bus information, wherein the column addresses of cells having at least one failure are stored in sequence in the special block 213.

In step of S306, the repairing steps S302 to S304 are repeated until the inspection of failures over every memory cell in the main cell array 210 has completed.

When the column address corresponding to the failed cell is stored in the special block 213, the column address is matched with corresponding redundancy column address.

The column address information of the redundancy cell array 220 for substituting the column corresponding to the cell having at least one failure is stored separately. Additionally, this process is performed in accordance with an internal algorithm so that the data input/output controlling block 270 can refer to the redundancy cell array 220 by detecting the repair.

As described before, the start address information of the special block 213 is stored separately in the start address fuse block 240 through the fuse cutting.

Hereinafter, the operation of the memory device repaired in accordance with the steps S300 to S306 will be described in detail.

FIG. 4 is a flow chart illustrating an operating process after the process of repairing the memory device according to one embodiment of the present invention.

Referring to FIG. 4, when power is inputted in step of S400, a processor (not shown) of the memory device loads the start address of the special block 213 stored in the start address fuse block in step of S402.

Subsequently, information in the special block 213 of the main cell array 210 started from the start address loaded by the page buffer 230 is loaded, and is transmitted to the repair information block 250 through a control bus CLTBUS.

In step of S404, the repair information block 250 stores the transmitted information in sequence in the first to Nth registers of the register section 251, respectively.

Further, the flag field of a register in which the column address REGN_COL<9:0> and the data input/output bus information REGN_IOBUS<3:0> are stored is set to '1'.

In step of S406, when the column address is inputted for the operation of the memory device after storing every data of the special block 213 in the first to Nth registers, it is detected whether or not the corresponding address has been repaired.

In other words, the inputted column addresses AX<9:0> are inputted to the first to Nth repair circuits. Then, each of the repair circuits compares the column address REGN_COL<9:0> stored in the first to Nth registers coupled thereto with the inputted column address AX<9:0>, and outputs the repair controlling signal in accordance with the comparison result.

In case that column address REGN_COL<9:0> identical to the column address AX<9:0> is stored in one of the first to Nth registers, the repair circuit coupled to the one outputs the repair controlling signal as '1' in step of S408, and also outputs the data input/output bus information REGN_IOBUS<3:0>.

In step of S410, the outputted repair controlling signal REGN_REP=1 and the data input/output bus information REGN_IOBUS<3:0> are inputted to the data input/output controlling block 260. The data input/output controlling block 260 discriminates whether or not the inputted column address has been repaired, and then performs the operation of substituting with a redundancy cell.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A memory device comprising:
a main cell array including a plurality of first memory cells configured to store data, wherein a special block for storing a column address corresponding to at least one first memory cell having at least one failure is disposed in an area of the main cell array;
an address block configured to store address information of the special block; and
a repair information block configured to output a repair controlling signal according to the column address stored in the special block when the memory device is in operation, wherein the repair information block comprises:
a plurality of registers each configured to store the column address stored in the special block; and
a plurality of repair circuits respectively coupled to the plurality of registers, wherein each repair circuit is configured to output the repair controlling signal.

2. The memory device of claim 1, wherein the special block includes cascading columns made up of at least one cell.

3. The memory device of claim 1, wherein the address block includes a plurality of fuses for storing a start address of the special block.

4. The memory device of claim 1, wherein each of the registers includes:
a column address;
data input/output bus information assigned to the column address; and
flag information configured to indicate storage of the column address.

5. The memory device of claim 4, wherein each of the repair circuits includes:
a first buffer configured to output the column address by the flag information of the corresponding register;
a plurality of XOR gates, wherein the column address outputted through the first buffer is inputted to one of input terminals of each of the XOR gates, and an address inputted for operating the memory device is inputted to the other terminal of each of the XOR gates;
a NOR gate configured to receive the outputs of the XOR gates; and
a second buffer configured to output the data input/output bus information of the corresponding register in accordance with an output of the NOR gate, wherein the output of the NOR gate is generated by using the outputs of the XOR gates as input to the NOR gate.

6. The memory device of claim 4, further comprising:
a redundancy cell array including a plurality of second memory cells used to replace the at least one first memory cell having at least one failure and to store data; and
a data input/output controlling block configured to substitute the at least one first memory cell having at least one failure with a redundancy cell of the second memory cells in accordance with an output of the repair information block.

7. The memory device of claim 6, wherein the data input/output controlling block receives the repair controlling signal and the data input/output bus information from the repair information block.

8. A method of repairing a memory device comprising:
detecting a memory cell having a failure; and
storing address information of the memory cell having the failure in a predetermined special block included in a main cell array in accordance with the detection result, wherein the address information stored in the special block includes a column address corresponding to the memory cell having the failure and a data input/output bus information assigned for data input/output of a corresponding column.

9. The method of claim 8, further comprising:
storing a start address of the special block through fuse cutting.

10. The method of claim 8, further comprising:
storing the address stored in the special block in each of a plurality of registers by loading in sequence the address;
comparing an inputted address with the address stored in the register; and
outputting a repair controlling signal in accordance with the comparison result.

11. A method of repaning a memory device comprising:
providing a main cell array including a special block; and
storing an address information in the special block, the address information including a column address of a failed memory cell and a data input/output bus information assigned for data input/output of a corresponding column.

12. A memory device comprising:
a main cell array including a plurality of first memory cells configured to store data, wherein a special block for storing a column address corresponding to at least one first memory cell having at least one failure is disposed in an area of the main cell array;
an address block configured to store a start address of the special block; and
a repair information block configured to read address information of the special block based on the start address and to store the address information in a register unit when the memory device is powered on and configured to output a repair controlling signal according to the address information when the memory device is in operation.

13. The memory device of claim 12, wherein the special block includes cascading columns comprising at least one cell.

14. The memory device of claim 12, wherein the address block includes a plurality of fuses for storing the start address of the special block.

15. The memory device of claim 12, wherein the repair information block comprises:
a plurality of registers each configured to store the column address stored in the special block; and
a plurality of repair circuits respectively coupled to the plurality of registers, wherein each repair circuit is configured to output the repair controlling signal.

16. The memory device of claim 15, wherein each of the registers comprises:
a column address;
data input/output bus information assigned to the column address; and
flag information configured to indicate storage of the column address information.

17. The memory device of claim 16, wherein each of the repair circuits comprises:
a first buffer configured to output the column address by the flag information of corresponding register;
a plurality of XOR gates, wherein the column address outputted through the first buffer is inputted to one of input terminals of each of the XOR gates, and an address inputted for operating the memory device is inputted to the other terminal of each of the XOR gates;
a NOR gate configured to receive the outputs of the XOR gates; and
a second buffer configured to output the data input/output bus information of the corresponding register in accordance with an output of the NOR gate, wherein the output of the NOR gate is generated by using the outputs of the XOR gates as an input to the NOR gate.

* * * * *